United States Patent [19]

Scharrer

[11] Patent Number: 4,932,027
[45] Date of Patent: Jun. 5, 1990

[54] SINGLE-LEVEL MULTIPLEXER

[75] Inventor: Carl J. Scharrer, Plano, Tex.

[73] Assignee: Texas Instruments Incorporated, Dallas, Tex.

[21] Appl. No.: 171,617

[22] Filed: Mar. 22, 1988

[51] Int. Cl.$^5$ .................. H04J 3/04; H03K 17/56; H03K 17/40; H03K 17/52

[52] U.S. Cl. ...................... 370/112; 307/243; 328/104

[58] Field of Search .............. 370/112; 307/241, 243; 328/71, 104

[56] References Cited

U.S. PATENT DOCUMENTS

| 3,638,131 | 1/1972 | Sarkissian | 307/243 |
|---|---|---|---|
| 3,783,307 | 1/1974 | Breuer | 307/243 |
| 4,349,750 | 9/1982 | Geurts | 307/243 |
| 4,415,815 | 11/1983 | Dijkmans et al. | 307/243 |
| 4,572,967 | 2/1986 | Metz | 307/243 |

Primary Examiner—Robert L. Griffin
Assistant Examiner—Wellington Chin
Attorney, Agent, or Firm—Carlton H. Hoel; Thomas W. DeMond; Melvin Sharp

[57] ABSTRACT

A single-level multiplexer (70) has a plurality of stages (72–78), one for each bit. In each stage, a select transistor (84) has a current path coupling an output node (86) to a common node (88), and a control element that is coupled to a select signal line (80). A data transistor (90) has a current path connecting a voltage supply (92) to the common node (88), and a control element connected to a data signal source (82). Common node (88) is connected to a current source (94, 96, 98, 100). The output node (86) of each stage is coupled together with the output nodes of the other states to an output (108) of the multiplexer.

18 Claims, 2 Drawing Sheets

| S | D | f |
|---|---|---|
| 0 | 0 | 1 |
| 0 | 1 | 1 |
| 1 | 0 | 0 |
| 1 | 1 | 0 |

SINGLE-LEVEL MULTIPLEXER

TECHNICAL FIELD OF THE INVENTION

This invention relates in general to multiplexers, and in particular to multiplexers having data and select transistors configured in a single level.

BACKGROUND OF THE INVENTION

Prior art multiplexer stages have separate transistor levels for the select transistor and the data transistor. One stage is provided for each bit. In conventional multiplexer stage design, the select transistor has a current path that connects an output node to a common node, and a voltage threshold transistor that connects a voltage supply to this common node. The select transistor and the voltage threshold transistor are thus connected as a differential pair. A data transistor of the stage selectively connects the common node to a current source. One example of such a conventional design is the multiplexer described in U.S. Pat. No. 4,686,674 issued to N.C. Lam.

At least two disadvantages have become apparent in the use of this prior art type of structure. First, four transistors are necessary for each multiplexer stage or bit: a select transistor, a voltage threshold transistor, a data transistor and a current source transistor. Area has to be accorded in the layout for each of these transistors, together with conductors for the signals that control them.

Another disadvantage relates to the operation of a conventional multiplexer stage. Since the select transistor and the voltage threshold transistor are connected as a differential pair, a signal on the select line that is substantially higher than the signal on the voltage threshold line will select the stage. The output will then "see" the state of the common node of the selected state, which will be charged or not depending on whether the data transistor has been rendered conductive. If a select signal is applied to the select transistor before a high data signal is applied to the data transistor, the common node may be charged for a short time before it is discharged once the high data signal is applied. The output node will thus be high for a short time before it is discharged to a low condition, thereby causing a glitch in the data output of the multiplexer. A need has therefore arisen for a multiplexer that uses less transistors per stage while avoiding the above-noted possibility of a data glitch.

SUMMARY OF THE INVENTION

The present invention overcomes the above-noted limitations of conventional designs by providing, for each stage, a select transistor and a data transistor that are connected as a differential pair. The select transistor selectively couples an output node of the stage to a common node, while the data transistor selectively couples a voltage supply to this common node. The common node is connected to the current path of a current source transistor. This arrangement provides the advantages of eliminating the need for the voltage threshold transistor and the need for routing a conductor to carry the voltage threshold signal. Improvements can be obtained in the operation of the multiplexer in terms of power consumption and speed.

The circuit of the invention uses a high select signal that is operable to deselect the stages to which it is applied, while a low select signal is used to select one stage of the multiplexer. When the high data signal is applied to the data transistor signal at the same time that the low select signal is applied to the select transistor, substantially more current flows through the data transistor than the select transistor. On the other hand, if a low select signal is applied to the select transistor and a low data signal is applied to the data transistor, substantially more current will flow through the select transistor than the data transistor. In a preferred embodiment, the voltage swing between high and low levels of the select signal is approximately fifty percent offset from the voltage swing between the high and low levels of the data signal.

Since the present invention uses a low select signal to select a particular multiplexer stage, the timing of the arrival of the select and data signals is no longer critical, and the above-described data glitch will be prevented.

BRIEF DESCRIPTION OF DRAWINGS

Further aspects of the invention and their advantages are disclosed in the following Detailed Description when taken in conjunction with the Drawings, in which.

DETAILED DESCRIPTION OF THE INVENTION

Figures 1, 2, 3, 4:
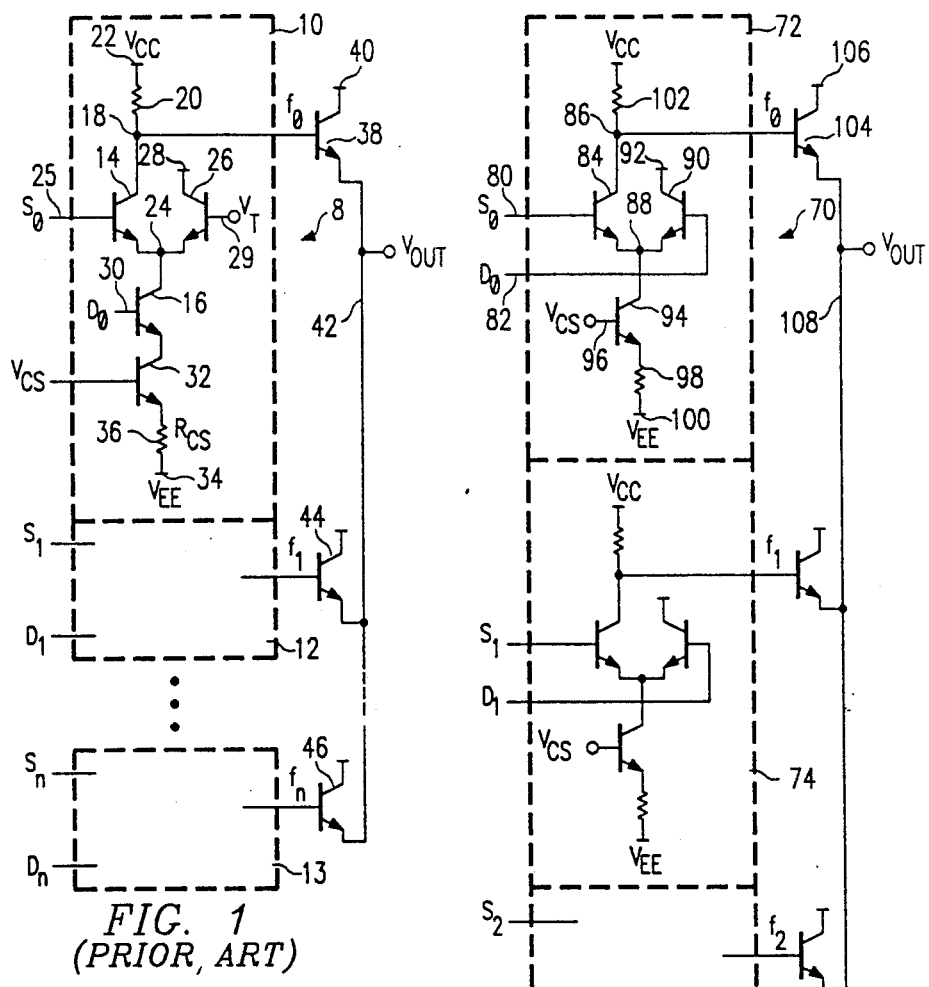
FIG. 1 is an schematic electrical diagram of a multiplexer according to the prior art.
FIG. 2 is a schematic electrical diagram of a multiplexer according to the invention.
FIG. 3 is a graph showing the high and low voltage level of select and data signals applied to a particular multiplexer stage according to the invention.
FIG. 4 is a truth table showing the operation of a selected multiplexer stage according to the invention.

FIG. 1 is an electrical schematic diagram of a multiplexer according to the prior art. The multiplexer is indicated generally at 8, and has a plurality of stages 10, 12 and 13 indicated by dashed boxes, each stage multiplexing a separate bit. The construction of each multiplexer stage is similar to the rest, and therefore only the detailed circuitry for the first multiplexer stage 10 is shown.

Stage 10 includes a select transistor 14 and a data transistor 16. Select transistor 14 has a collector connected to an output node 18. Node 18 is connected through a resistor 20 to a voltage supply 22. An emitter of select transistor 14 is connected to a common node 24. A base of select transistor 14 is connected to a select signal line 25.

A threshold transistor 26 is connected such that transistors 14 and 26 form a differential pair. A collector of transistor 26 is connected to a voltage supply 28, while an emitter thereof is connected to common node 24. A base of transistor 26 is connected to a threshold voltage source 29.

A base of data transistor 16 is connected to a data signal line 30. A collector of data transistor 16 is connected to common node 24 and an emitter thereof is connected to the collector of a current source transistor 32. The base of current source transistor 32 is connected to a current source voltage supply $V_{CS}$, and an emitter thereof is connected to a voltage reference 34 through a current source resistor 36.

Output node 18 is connected to the base of an output transistor 38, which has a collector connected to a voltage supply 40 and an emitter connected to a common output line 42. Each stage of the multiplexer has a like output transistor, such as transistor 44 and transistor 46, that has its emitter connected in common to output line 42.

As can be seen, each multiplexer stage requires four transistors for operation, and each of these transistors requires a control line to operate them. Layout area needs to be accorded for each of these transistors and control lines, and each transistor consumes power. Further, the connection of the select and data transistors in series in two levels causes an additional propagation delay when the state of node 18 changes.

A particular stage of the prior art multiplexer structure is selected by a high signal on one of the select lines 25. When a select line 25 and a data line 30 are both high, output node 18 is coupled to the current path of current source transistor 32, and therefore will be in a low state. If data line 30 is low, then output node 18 will be high. This structure presents an opportunity for a data glitch if the high select signal on line 25 arrives prior to a high data signal on line 30. In this case, output line 42 will "see" a high state before it sees a low state, thereby causing a glitch in the data that is read out.

Referring now to FIG. 2, a single-level multiplexer according to the present invention is shown generally at 70. Multiplexer 70 comprises a plurality of stages 72–78 shown by dashed boxes, each stage decoding a respective bit of data. While only two stages 72 and 74 are shown in detail, it is to be understood that multiplexer 70 can have any selected number of stages.

The circuitry comprising each stage 72–78 is similar, and a description of one stage 72 therefore suffices for the rest. In stage 72, a select line 80 and a data line 82 are provided as inputs. A select transistor 84 has a collector connected to an output node 86, a base connected to select line 80 and an emitter connected to a common node 88. A data transistor 90 has a collector connected to a voltage supply 92, a base connected to data line 82, and an emitter connected to common node 88. A current source transistor 94 has a collector connected to node 88, a base connected to a current source line 96, and an emitter connected through a current source resistor 98 to a voltage supply $V_{EE}$ 100. Output 86 is connected through a resistor 102 to a voltage supply $V_{CC}$.

Output node 86 is further connected to the base of an output transistor 104. A collector of output transistor 104 is connected to a voltage supply 106, and an emitter is connected to a common output line 108. The emitters of the output transistors in the remaining stages are likewise connected to output line 108.

Since the select transistor 84 and the data transistor 90 are connected as a differential pair at a single level, an increment of propagation delay experienced when node 86 changes state is eliminated.

The operation of the single-level multiplexer 70 shown in FIG. 2 can best be described with reference to both FIGS. 2 and 3. FIG. 3 is a graph showing the voltage levels of the select and data signals applied to any particular multiplexer stage, such as stage 72. The voltage that appears on select line 80 (FIG. 2) varies between a first high select voltage level $V_1$ (FIG. 3) and a second low select voltage level $V_2$. The signal appearing on data line 82 (FIG. 2) swings between a high data voltage level $V_3$ and a low data voltage level $V_4$. The voltage swing between $V_1$ and $V_2$ is preferably about fifty percent offset from the voltage swing between voltages $V_3$ and $V_4$ to provide the following novel differential amplifier effect.

Referring to FIG. 2, suppose that the high select voltage $V_1$ is present on select line 80, and the high data voltage $V_3$ is present on data line 82. A constant amount of current will flow through node 88 as permitted by current source transistor 94, and the relative voltages on lines 80 and 82 will determine the contributions made to this current by the current paths of transistors 84 and 90, respectively. Voltages $V_1$ and $V_3$ are selected such that much more current will flow through transistor 84 than transistor 90 when these voltages are applied to the select line 80 and the data line 82, respectively. Preferably, the voltages should be selected such that the ratio of current passing through the current paths of transistors 84 and 90 is at least 32:1. In the illustrated embodiment, such a current ratio is obtained when voltage level $V_1$ is separated from voltage level $V_3$ by a voltage difference $V_{13}$ of about 100 millivolts.

When the select line voltage 80 is at the high select level $V_1$, the multiplexer stage 72 is effectively deselected. This is further illustrated by FIG. 4, which is a truth table of the output f as a function of the inputs S and D for any particular stage. Where the select line S is high or (1), the output f will be zero regardless of the signal present on the data line 82. This is because node 86 (FIG. 2) will be pulled low by the conducting current path of transistor 84.

A low value on select line 80 selects the multiplexer stage 72 as follows. When select line 80 is low, it is at a voltage level $V_2$ that is preselected to be at least roughly midway between high data voltage $V_3$ and low data voltage $V_4$. The voltage difference $V_{32}$ and the voltage difference $V_{24}$ are, in the illustrated embodiment, each about 100 millivolts. When a high data voltage $V_3$ is applied on data line 82 and a low select voltage $V_2$ is applied on select line 80, much more current will flow through data transistor 90 than select transistor 84. Where these two voltages are 100 millivolts apart in the illustrated embodiment, the current flow ratio is about 32:1. Node 86 will therefore be at a high charged state. This causes a high signal on line $f_0$, turning on output transistor 104. Therefore, a high signal will result on common output line 108.

On the other hand, where the low data voltage $V_4$ appears on data line 82 and the low select voltage $V_2$ appears on select line 80, much more current will flow through select transistor 84 than through data transistor 90. Again, the voltage differences are selected such that the current flow ratio is at least 32:1. Node 86 will therefore be relatively low, turning off output transistor 104. No high signal will therefore result on output line 108 from this stage.

The present invention avoids data glitches resulting from a lack of synchronicity between the application of the select and data signals. Where a high signal is applied to select line 80, the stage will be deselected, and it does not matter when any data signal is applied to data line 82. Therefore, no false data will appear on output line 108. The present invention further saves layout space in that less transistors are necessary per stage. The threshold transistor 26 in FIG. 1 is replaced with the select transistor 84 in FIG. 2, and a separate-level select transistor 16 (FIG. 1) is eliminated. Further space is saved in that a threshold voltage supply line, such as line 52 in FIG. 1, may be eliminated. Also, because less transistors are involved per stage, improvements can be obtained in power consumption and speed.

Figure 5:
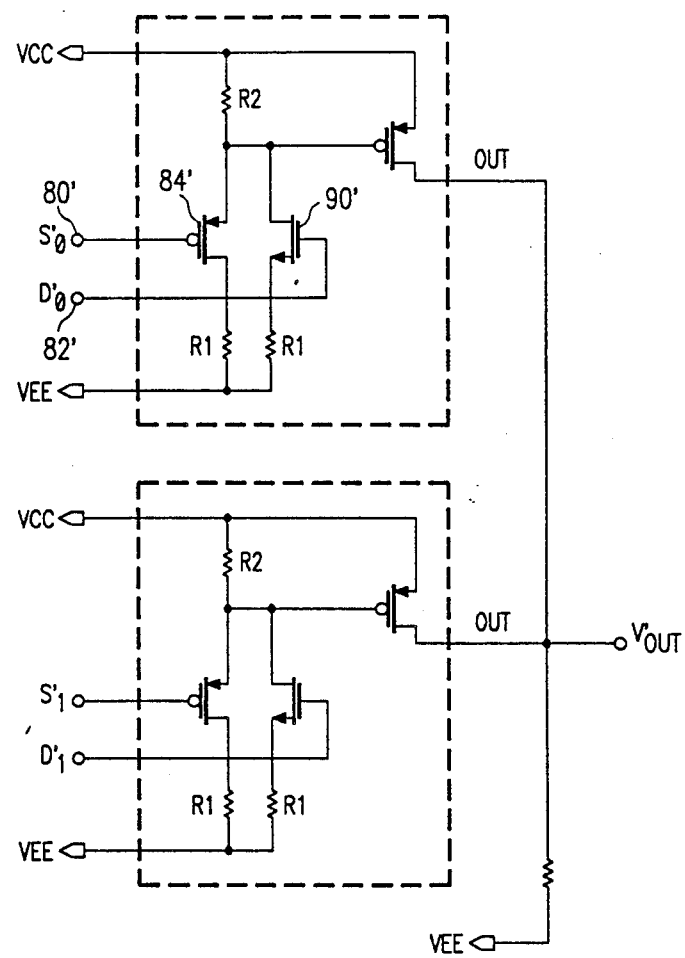
FIG. 5 is a schematic electrical diagram of another embodiment of the multiplexer according to the invention.

While the present invention has been described using bipolar technology, it can also be applied with field-effect transistor (FET) technology or its many variants. All that is required is that the field-effect transistor equivalents of transistors 84 and 90 operate in saturated mode. An embodiment of the invention incorporating FET transistors is illustrated in FIG. 5.

While a preferred embodiment and its advantages have been described in the above detailed description, the invention is not limited thereto but only by the scope and spirit of the appended claims.

I claim:

1. A single-level multiplexer having a plurality of stages, each stage comprising:
   a select transistor having a current path and a control element for controlling the conductance of said current path, one end of said current path coupled to an output node, a second end of said current path coupled to a current source, said control element coupled to a select signal source;
   a data transistor having a current path for selectively coupling a voltage reference to said current source, a control element of said data transistor coupled to a data signal source for controlling the conductance of said data transistor current path; and
   said output nodes of said stages coupled in common to an output of said multiplexer.

2. The multiplexer of claim 1, wherein said select transistor and said data transistor are comprised of bipolar transistors.

3. The multiplexer of claim 1, wherein said select transistor and said data transistor are comprised of field effect transistors that are operated in the saturated region.

4. The multiplexer of claim 1, wherein each stage further comprises an output transistor having a control element coupled to said output node and a current path controlled by said control element for selectively coupling a voltage supply to said output of said multiplexer.

5. The multiplexer of claim 1, wherein each said selected transistor is operable to switch between a high, first voltage and a low, second voltage, each said data transistor operable to switch between a high, third voltage and a low, fourth voltage;
   the difference between said high first and high third voltages preselected such that when said first voltage is applied to said select transistor control element and said third voltage is applied to said data transistor control element, substantially more current will flow through said select transistor current path than through said data transistor current path.

6. The multiplexer of claim 5, wherein the voltage swing between said first voltage and said second voltage is offset by approximately fifty percent from the voltage swing between said third voltage and said fourth voltage.

7. The multiplexer of claim 5, wherein the difference between said first voltage and said second voltage is approximately 100 millivolts.

8. The multiplexer of claim 5, wherein the difference between said second voltage and said third voltage is approximately 100 millivolts.

9. The multiplexer of claim 5, wherein the difference between said third voltage and said fourth voltage is approximately 100 millivolts.

10. The multiplexer of claim 5, wherein the ratio of current flowing through the current path of said select transistor to the current flowing through the current path of said data transistor is at least 32:1 when said first voltage is applied to said select transistor control element and said third voltage is applied to said data transistor control element.

11. The multiplexer of claim 5, wherein the difference between said third voltage and said second voltage is selected such that when said third voltage is applied to said control element of said data transistor and said second voltage is applied to said control element of said select transistor, substantially more current will flow through said data transistor current path than through said select transistor current path.

12. A stage for a multiplexer, comprising:
   a select transistor and a data transistor having current paths coupled in common to a current source node;
   said current path of said select transistor selectively coupling said current source node to an output node, a voltage supply coupled to said output node, said current path of said data transistor selectively coupling said current source node to a voltage supply;
   a control element of said select transistor coupled to a select signal source for controlling the conductance of said current path of said select transistor; and
   a control element of said data transistor coupled to a data signal source for controlling the conductance of said current path of said data transistor current path.

13. A method for multiplexing a plurality of data signals to produce one output signal using a multiplexer having a plurality of stages, one stage for each data signal, each stage having a select transistor and a data transistor with the current paths thereof connected at one end in common to a single current source, an opposed end of the current path of the select transistor coupled to an output node, the method comprising the steps of:
   selecting one stage by transmitting a low select signal to the control element of the select transistor of the one stage;
   transmitting either a high data signal or a low data signal to a control element of the data transistor in the selected stage;
   if the high data signal is transmitted, conducting substantially more current through the current path of the data transistor of the selected stage than through the current path of the select transistor of the selected stage, and outputting a high signal on the output node as a result; and
   if the low data signal is transmitted, conducting substantially more current through the current path of the select transistor of the selected stage than through the current path of the data transistor of the selected stage, such that a low signal will appear at the output node.

14. The method of claim 13, and further including the steps of:
   deselecting all but one of the stages by transmitting a high select signal to the control elements of the select transistors of said stages; and
   selecting the level of the high data signal to be between the level of the high select signal and the level of the low select signal.

15. The method of claim 14, and further including the step of preselecting the level of the high data signal to be about midway between the level of the high select signal and the level of the low select signal.

16. The method of claim 15, and further comprising the step of selecting the high and low data signal levels and the high and low select signal levels such that the swing between the high and low data signal levels is approximately fifty percent offset from the swing between the high and low select signal levels.

17. The method of claim 13, and further including the step of selecting the level of the low select signal such that it is between the level of the high data signal and the level of the low data signal.

18. The method of claim 13, and further comprising the step of selecting the levels of the high data signal, the low data signal and the low select signal such that when the high data signal is transmitted to the data transistor of a selected stage, the ratio of current conducted through the current path of the data transistor to the amount of current conducted through the current path of the select transistor is at least 32:1, and such that when the low data signal is transmitted to the data transistor of the selected stage, the ratio of current flowing through the current path of the select transistor to the current flowing through the current path of the selected data transistor is at least 32:1.

* * * * *